United States Patent
Yamamoto et al.

(10) Patent No.: US 7,750,364 B2
(45) Date of Patent: Jul. 6, 2010

(54) LIGHT-EMITTING DEVICE

(75) Inventors: Kazushige Yamamoto, Kanagawa-ken (JP); Tatsuo Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/199,148

(22) Filed: Aug. 27, 2008

(65) Prior Publication Data
US 2009/0057689 A1    Mar. 5, 2009

(30) Foreign Application Priority Data
Aug. 28, 2007    (JP) ............................. 2007-221545

(51) Int. Cl.
*H01L 27/15* (2006.01)
(52) U.S. Cl. ................. 257/103; 257/102; 257/E33.01; 257/E33.035
(58) Field of Classification Search ................. 257/102, 257/103, E33.01, E33.035
See application file for complete search history.

(56) References Cited

U.S. PATENT DOCUMENTS

| | | | |
|---|---|---|---|
| 7,446,348 B2 * | 11/2008 | Yamamoto et al. | 257/102 |
| 7,550,779 B2 * | 6/2009 | Yamamoto et al. | 257/103 |
| 2007/0145394 A1 | 6/2007 | Shimizu et al. | |
| 2007/0152234 A1 * | 7/2007 | Yamamoto et al. | 257/103 |
| 2007/0160101 A1 * | 7/2007 | Konig et al. | 372/50.12 |
| 2007/0267711 A1 | 11/2007 | Yamamoto et al. | |
| 2008/0061369 A1 | 3/2008 | Shimizu et al. | |
| 2008/0079022 A1 | 4/2008 | Yamamoto et al. | |

OTHER PUBLICATIONS

U.S. Appl. No. 12/409,693, filed Mar. 24, 2009, Yamamoto, et al.
Lorenzo Pavesi, "Routes toward silicon-based lasers", Materials Today, Jan. 18, 2005, pp. 18-25.
Philippe M. Fauchet, "Light emission from Si quantum dots", Materials Today, Jan. 26, 2005, pp. 26-33.
T.G. Brown, et. al, "Optical emission at 1.32 μm from sulfur-doped crystalline sillicon", Appl. Phys. Lett., Aug. 4, 1986, vol. 49, No. 5, pp. 245-247.
U.S. Appl. No. 12/617,104, filed Nov. 12, 2009, Yamamoto, et al.

* cited by examiner

*Primary Examiner*—Bradley K Smith
*Assistant Examiner*—Marvin Payen
(74) *Attorney, Agent, or Firm*—Oblon, Spivak, McClelland, Maier & Neustadt, L.L.P.

(57) ABSTRACT

A light-emitting device includes an active region, an n-type region, a p-type region, an n-electrode and a p-electrode. The active region is formed from a semiconductor material. The semiconductor material has a tetrahedral structure and includes an impurity. The impurity creates at least two energy levels connected with the allowed transition within a band gap of the semiconductor material. The n-type and p-type regions in contact with the active region are disposed between the n-type and p-type regions. An excitation element is configured to inject an electron from the n-type region and inject a hole from the p-type region so as to generate an electron-hole pair in the active region. The active region has a thickness no less than an atomic distance of the semiconductor and no more than 5 nm.

16 Claims, 13 Drawing Sheets

NR

LR

LIGHT-EMITTING DEVICE

CROSS REFERENCE TO RELATED APPLICATION

This application is based upon and claims the benefit of priority from the prior Japanese Patent Application No. 2007-221545, filed on Aug. 28, 2007; the entire contents of which are incorporated herein by reference.

FIELD OF THE INVENTION

The present invention relates to a light-emitting device, and more particularly to a light-emitting device having an active layer of an impurity-doped semiconductor film.

DESCRIPTION OF THE BACKGROUND

Silicon photonics technology is a key to the future ultra fast optical electronics and has been frequently reported in recent years. Silicon photonics technology is based on silicon materials, which had been considered to be unsuitable for optical applications. Silicon photonics technology includes, for example, a silicon Raman laser which oscillates by photoexcitation and a silicon optical modulation device which performs an ultra fast GHz operation.

In the silicon photonics, optical interconnections are formed on a chip by a CMOS compatible LSI technology. The optical interconnects have functions of emission, transmission and reception and includes individual optical electronics elements. Silicon based optical modulation devices, switches, waveguides and light-receiving devices have been actively investigated primarily in the United States. However, silicon based current injection type light-emitting devices have not been successfully developed as practical devices.

A current injection type silicon light-emitting device functions as a "transmitter" in the optical interconnection and is considered as a key semiconductor light source. Current injection type silicon light-emitting devices are highly advantageous from the standpoint of the cost and manufacturing requirements. However, such silicon light-emitting devices are difficult to achieve because silicon (Si) is an indirect band gap semiconductor and is non-radiative because of a phonon-assisted transition.

Lorenzo Pavesi., Materials Today, January 2005 and Philippe M. Faucet., Materials Today, January 2005 disclose that a silicon nano-particle and an ultra-thin silicon film have been proposed and investigated to provide a light-emitting function to silicon, in other words, to achieve the indirect-to-direct-transition modulation in silicon just like a direct band gap compound semiconductor with strong radiation represented by gallium arsenide (GaAs). However, practical silicon based current injection type light-emitting devices have not yet been realized. This has been an unsolved problem for about 20 years.

Both the nano-particle and the ultra-thin film have been considered to be derived from the "quantum confinement effect," from a view point of a light-emitting mechanism. Accordingly, many research institutes are trying to achieve silicon light-emitting devices base on this effect.

FIG. 1 is a band diagram of crystal silicon and gallium arsenide (GaAs). Gallium arsenide (GaAs) generates a strong interband emission derived from an optically allowed electric dipole transition. There are two conditions in order to realize a strong interband emission. One condition is a selection rule regarding wave numbers. According to the wave number selection rule, the energy gap must be minimized at a specific wave number. The other condition is a selection rule regarding the symmetry of a wave function. According to the symmetry selection rule, when either one of the conduction band and the valence band is even function, the other one is odd function, at the wave number where the gap is minimized.

The symmetry selection rule is described in more detail below. Intensity of emission and light absorption between two energy levels is represented by <upper energy level|transition dipole moment μ|lower energy level>. In the case of a direct band gap compound semiconductor, $<s|\mu|p> = \int (even \times odd \times odd) dr \neq 0$, where two energy levels are represented by s-orbital (even function) and p-orbital (odd function) on atomic orbital approximation. This results in a strong emission due to an optically allowed transition. On the other hand, in the case of indirect band gap semiconductor, $<p|\mu|p> = \int (odd \times odd \times odd) dr = 0$, where both two energy levels are represented by p-orbital. This results in non-radiative emission due to an optically forbidden transition.

Gallium arsenide (GaAs) has the minimum gap at the Γ point and satisfies the wave number selection rule. Further, wave functions of the conduction band and the valence band are represented by s-orbital and p-orbital respectively as described above, and therefore gallium arsenide (GaAs) satisfies the symmetry selection rule.

Noting the Si nano-particles and the ultra-thin Si films, the conduction band of silicon, which is located in the vicinity of the X point due to the quantum confinement effect, moves to the Γ point. The conduction band provides a direct transition so that the gap is minimized at the Γ point. The band shape is changed to satisfy the wave number selection rule due to the quantum confinement effect.

Considering the symmetry of a wave function, a wave function of the valence band is p-orbital and that of the conduction is also p-orbital. The symmetry of a wave function does not change even when the quantum confinement effect occurs. In other word, the symmetry selection rule is not satisfied.

It has been understood that the quantum confinement effect provides pseudo-direct transition in silicon. The quantum confinement effect may not cause a strong emission from silicon. Therefore, it has been understood that conventional silicon light-emitting devices do not have desired characteristics and are expected to be difficult to realize silicon light-emitting devices. This is indicated in FIG. 2, illustrating a contour drawing of internal quantum efficiency η of photoluminescence.

The vertical axis represents a radiative lifetime τr, the horizontal axis represents a non-radiative lifetime τnr, and the dotted line represents the contour drawing of the quantum efficiency. The reference crystal silicon and the direct gap compound semiconductor are oppositely positioned at η~0 and η~1 respectively. The lifetime r and τnr are an estimated value from literature.

As shown in FIG. 2, the quantum efficiency is 0 at the bottom-left corner and 1 at the upper-right corner. The efficiency drastically changes between 0 and 1 on the diagonal line connecting the bottom-left corner and the upper-right corner. This is because τr is long, and τr is strongly affected non-radiative recombination at the surface and defects. A nano-particle may show an efficient photoluminescence at the present time. However, even this nano-particle has τr of about micro seconds, and therefore has a very long radiative lifetime compared with a compound semiconductor.

Therefore, to realize silicon mission devices, it is desired to drastically improve the quantum efficiency so as not to be affected by the non-radiative recombination. In order to realize this, it is desired to introduce two energy levels connected with an optically allowed transition within the silicon band gap. These two energy levels may generate a strong emission, which is as strong as the compound semiconductor. However, in the conventional band modulation technologies such as the nano-particle and the ultra-thin film, the band modulation effect is limited, and therefore it is difficult to create the allowed transitions in silicon.

Meanwhile, there is a research using an active layer doped with specific impurity atoms. T. G. Brown and D. G. Hall., Appl. Phys. Lett. Vol. 45, No. 5 (1986) discloses that sulfur-doped (S-doped) crystal silicon was found by Brown at University of Rochester in 1986 and it has been known that the S-doped crystal silicon has an exceptional strong emission. However, the S-doped crystal silicon generates a strong emission only at low temperature. There is a problem in that the S-doped crystal silicon quenches at room temperature as shown in the temperature dependency of the photoluminescence (PL) of FIG. 5.

As described, practicable silicon-based light-emitting devices have not been realized by the conventional band modulation technologies.

SUMMARY OF THE INVENTION

Accordingly, one advantage of an aspect of the present invention is to provide a practical light-emitting device using an indirect band gap semiconductor.

To achieve the above advantage, one aspect of the present invention is to provide a light-emitting device which includes an active region. The active region is formed from a semiconductor material. The semiconductor material has a tetrahedral structure and includes an impurity. The impurity creates at least two energy levels connected with an optically allowed transition within a band gap of the semiconductor material. The light-emitting device further comprises an n-type region and a p-type region in contact with the active region. The active region is disposed between the n-type and p-type regions. An excitation element is configured to inject an electron from the n-type region and inject a hole from the p-type region so as to generate an electron-hole pair in the active region. The active region has a thickness no less than an atomic distance of the semiconductor and no more than 5 nm.

DETAILED DESCRIPTION OF THE INVENTION

Embodiments of the present invention will be described with reference to the drawings as follows.

The principle of photoluminescence from an active layer of impurity-doped ultra-thin silicon film according to the embodiments of the present invention will be described in detail, taking silicon as an example.

An impurity-doped ultra-thin silicon film is an ultra-thin silicon film having both a ground level and an excitation level derived from impurities within a band gap. As described below, (1) Relation between an energy level structure and a photoluminescence spectrum will be described, taking silicon as an example. (2) Temperature dependence of the photoluminescence will be described, showing a problem of quenching at room temperature. (3) Use of the impurity-doped ultra-thin silicon film as the active layer for solving the above problem and realization of a good photoluminescence characteristic at room temperature will be described. (4) Formation of the active layer using the impurity-doped ultra-thin silicon film will be described. (5) Types of impurities and matrix semiconductors applied to the embodiments of the present invention will be described.

Figure 1:
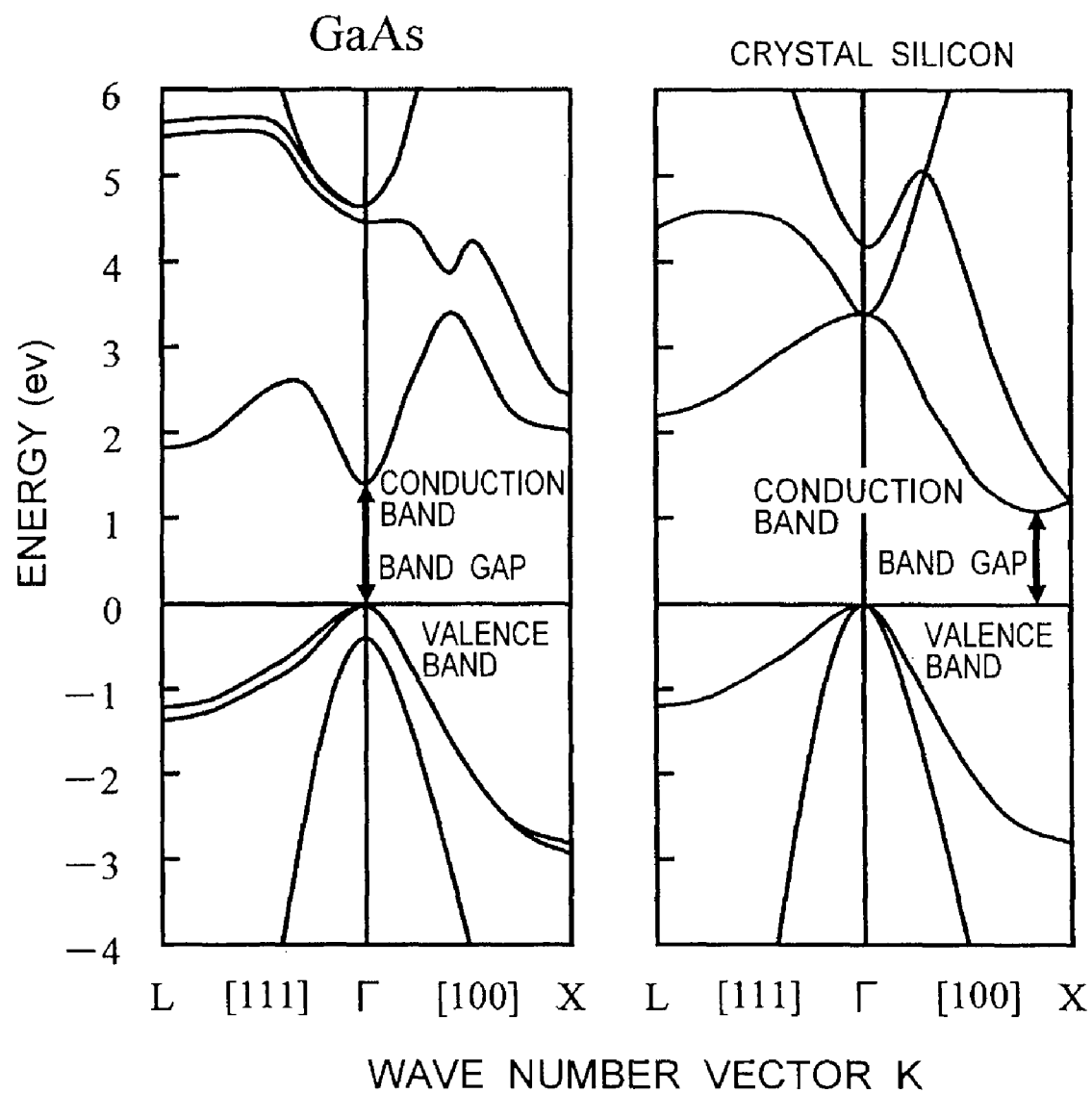
FIG. 1 is a schematic band diagram of crystal silicon and gallium arsenide (GaAs).
Figure 2:
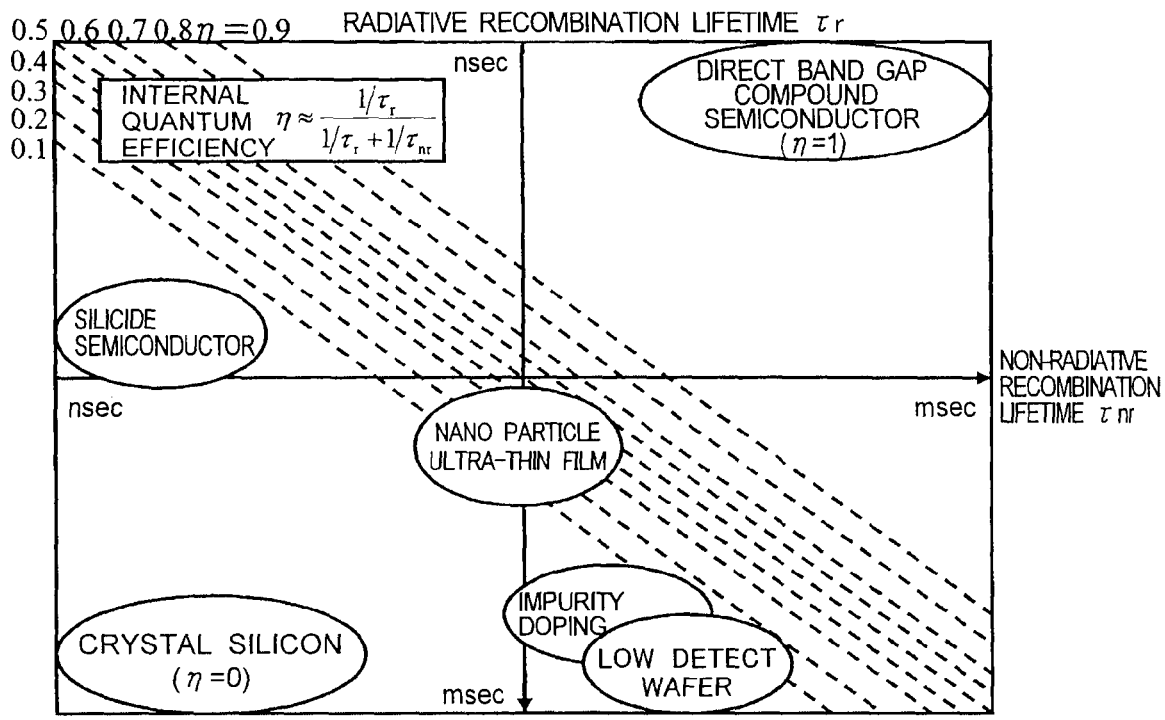
FIG. 2 is a contour chart of internal quantum efficiency of a conventional silicon light-emitting device.
Figure 3:
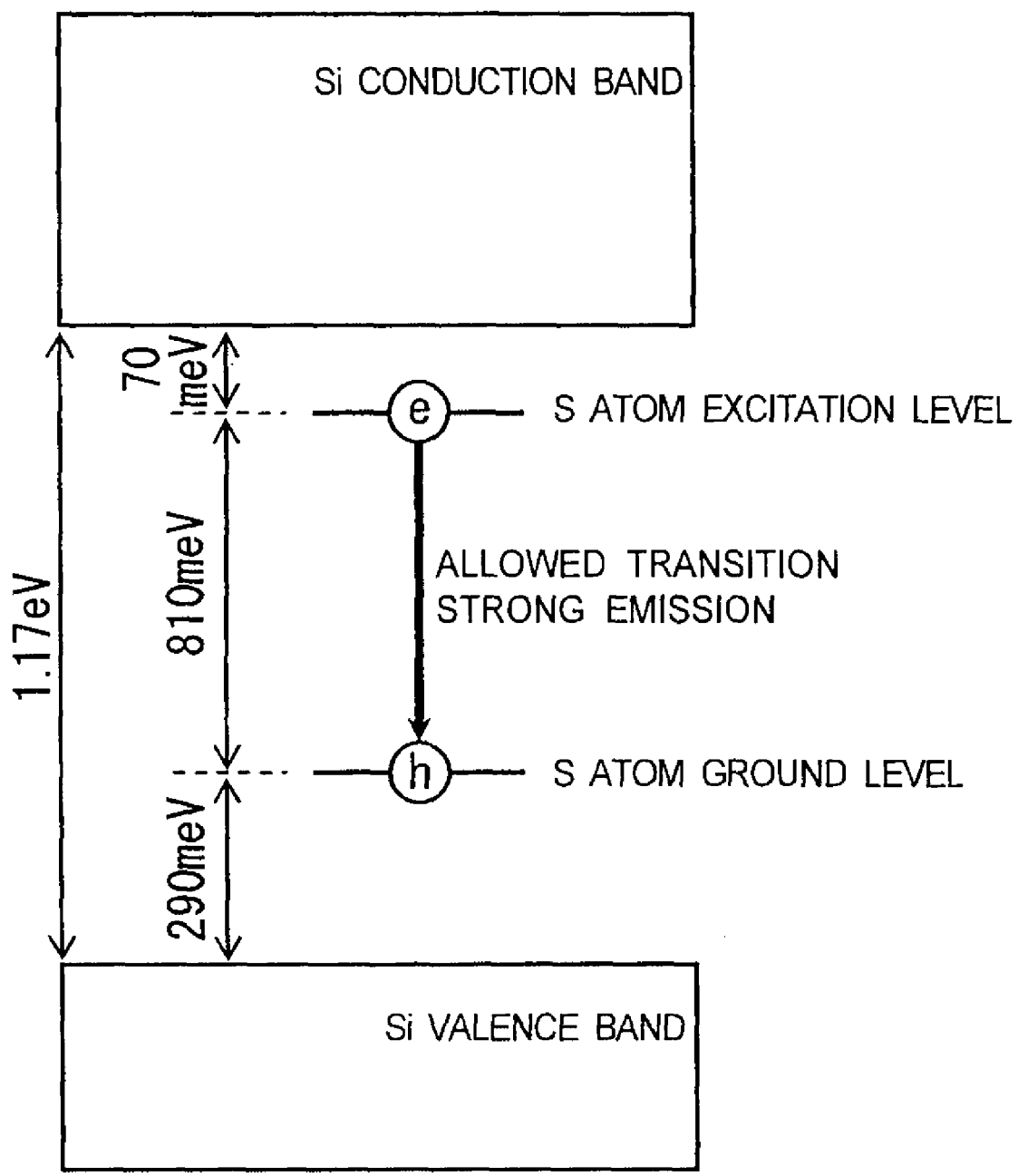
FIG. 3 is an energy diagram of sulfur-doped crystal silicon.

Energy level structure and a photoluminescence spectrum of sulfur-doped crystal silicon FIG. 3 is a diagram of impurity energy levels derived from S doped in crystal silicon. This system was found by Brown at University of Rochester in 1986 and it has been known that the S-doped crystal silicon generates an exceptional strong emission.

Figure 4:
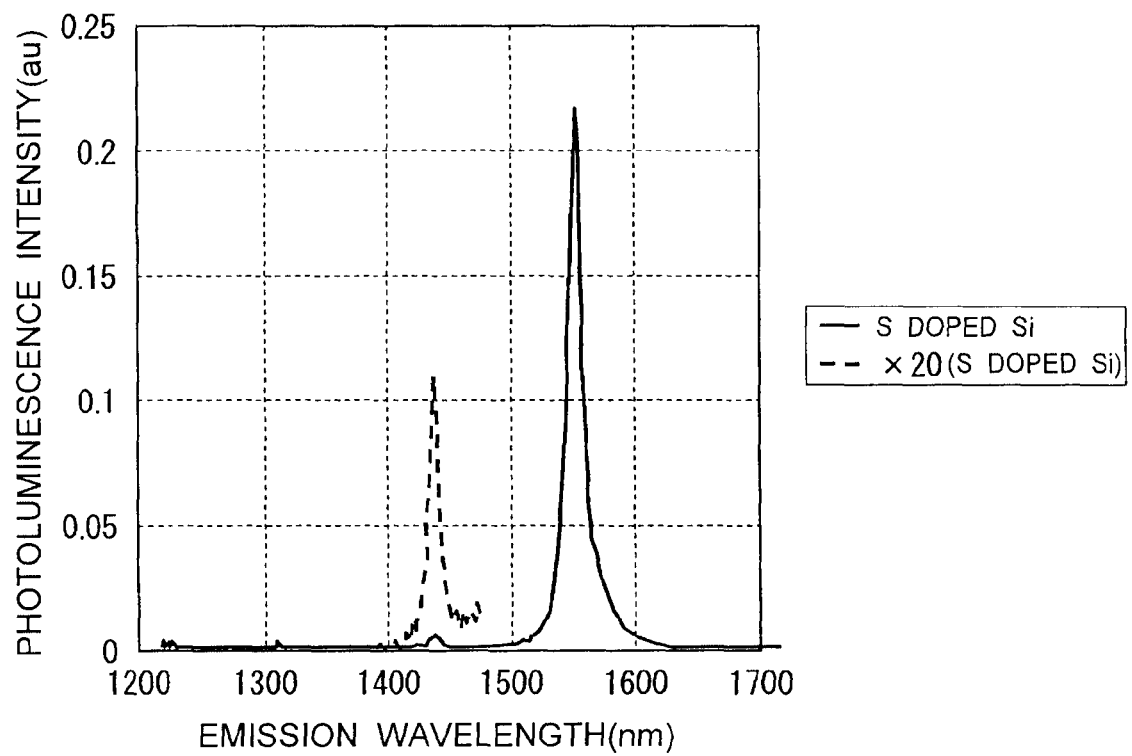
FIG. 4 is a graph of spectrum of sulfur-doped crystal silicon at helium (He) temperature.
Figure 5:
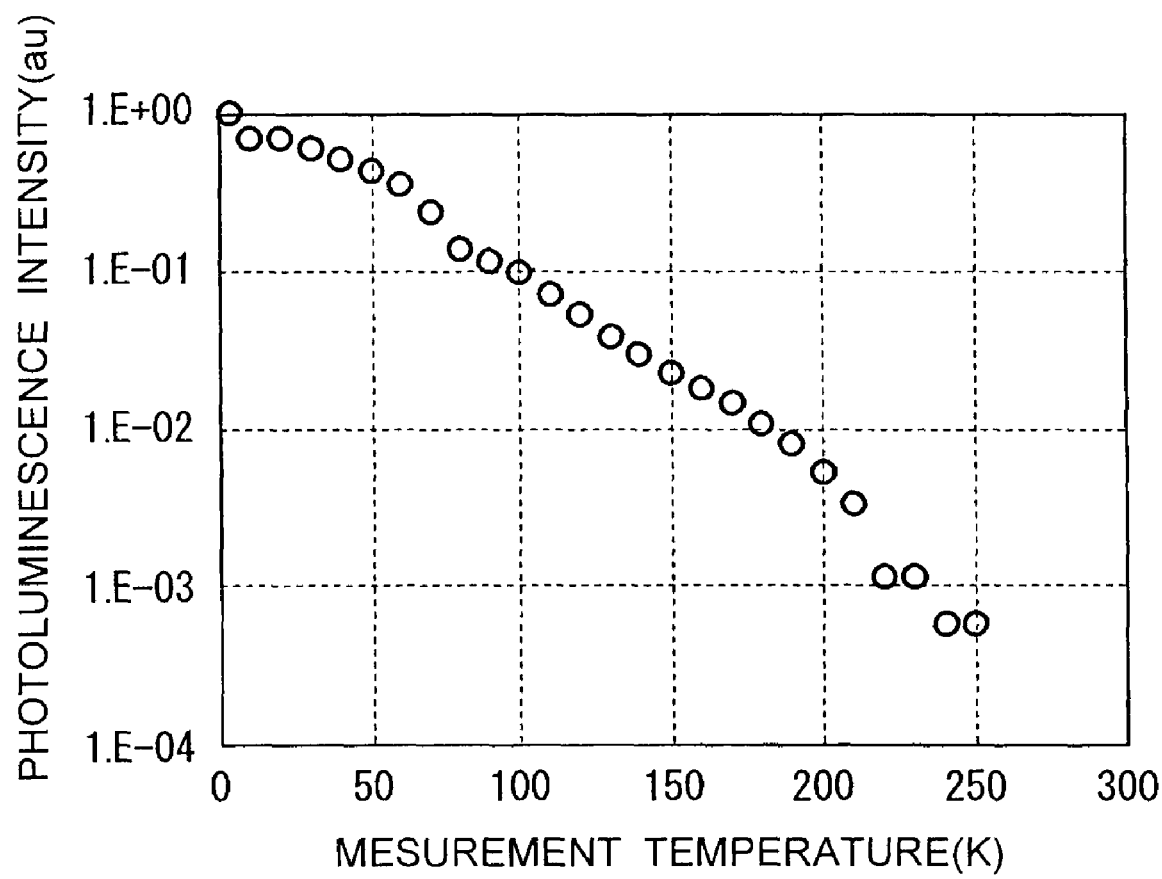
FIG. 5 is a graph of temperature dependency of the photoluminescence intensity of sulfur-doped crystal silicon.

FIG. 4 is a graph of a photoluminescence spectrum at helium (He) temperature. As for a correspondence relation between the photoluminescence spectrum and the energy level (i.e., the attribution of the spectrum), a strong peak at a wavelength near 1540 nm may indicate a transition from an excitation level to a ground level due to sulfur (S). A small peak at a wavelength near 1420 nm may indicate a transition from a silicon conduction band to a ground level.

The photoluminescence intensity is mainly determined by the wavelength of 1540 nm, and the external quantum efficiency is estimated to be about 5%. Considering an optical confinement effect due to the index difference between a crystal and an atmosphere gas, internal quantum efficiency becomes high (about 100%). Such high efficiency is the same energy level as in the case of the internal quantum efficiency of the direct gap compound semiconductor.

The mechanism of the strong emission is that both the ground level and the excitation level due to sulfur are created within the band gap of silicon. The band gap of the silicon is as narrow as about 1.1 eV.

However, the strong photoluminescence from the sulfur-doped crystal silicon is only generated at low temperature. The photoluminescence quenches at room temperature. This may be because an electron-hole pair of sulfur dissociates at room temperature due to the small binding energy. This is described with reference to the energy level diagram of FIG. 3. As shown in FIG. 3, it has been understood the energy difference between the excitation level and the conduction band is as small as 70 meV. In other words, since the binding energy of the electrons of sulfur is as small as 70 meV, the electron-hole pair dissociates and the crystal silicon quenches at room temperature.

Principle of room temperature luminescence by the impurity-doped ultra-thin silicon film It is believed that increasing the density of the electron-hole pair by increasing the binding energy is effective to realize the strong luminescence from the sulfur-doped silicon at room temperature.

Figure 6:
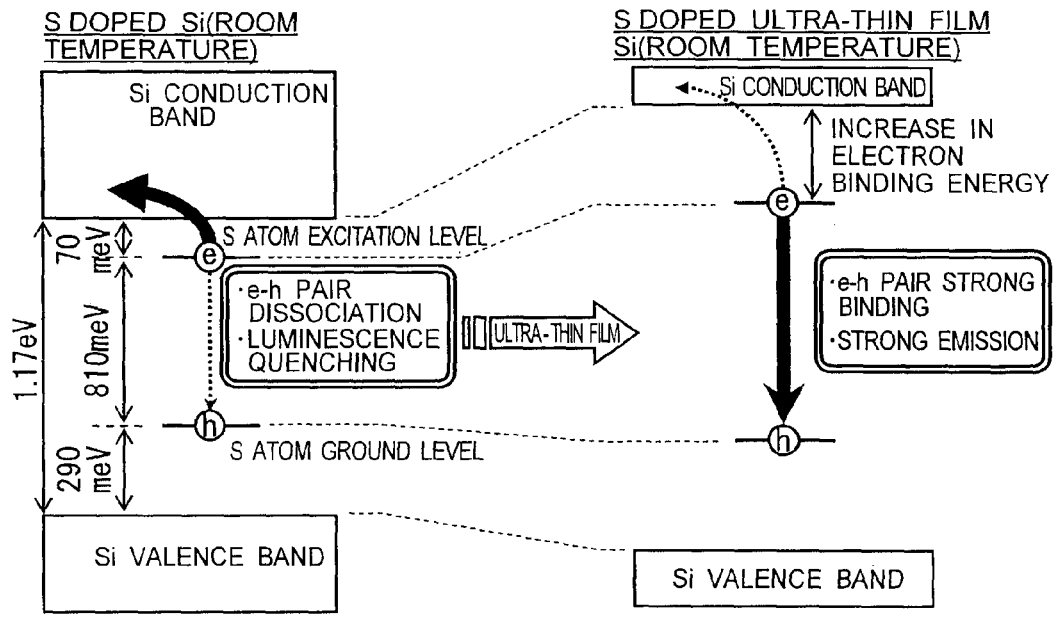
FIG. 6 is a comparative diagram of an energy level of sulfur-doped ultra-thin silicon film and that of conventional sulfur-doped crystal silicon.

FIG. 6 is a diagram of an energy level of sulfur-doped ultra-thin silicon film which enables the room temperature luminescence.

A principle of the room temperature luminescence is to increase the binding energy of an electron by the quantum confinement effect caused by the ultra-thin film, to increase the number of pair by increasing the biding of the electron-hole pair, and to enhance the luminescence from the energy level due to sulfur.

Figure 7:
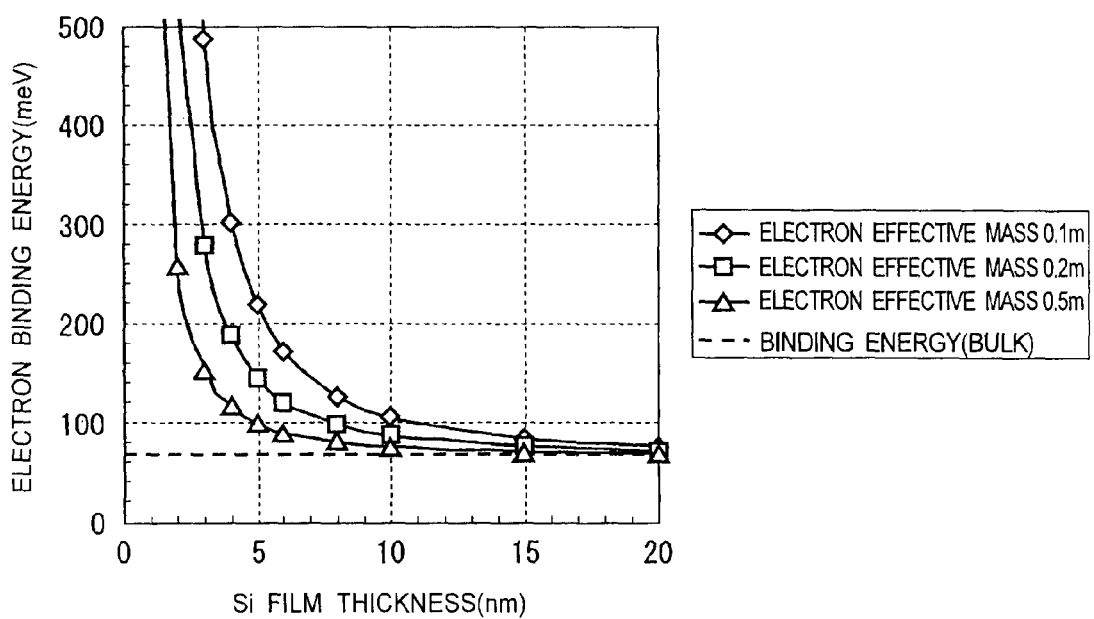
FIG. 7 is a graph of a calculation result of an electron binding energy for the film thickness of silicon.

FIG. 7 is a graph of an estimation result of an electron binding energy for the film thickness of silicon. Since the effective mass of the electron is unclear, the calculation was performed for several possible values of electron effective mass (i.e., 0.1 m, 0.2 m and 0.5 m), where "m" denotes the electron mass.

As shown in FIG. 7, it has been understood that the target thickness of S-doped silicon is no more than 5 nm, when the target value of the binding energy is 200 meV, in a case where the effective mass of the electron is 0.1 m. In the same way, the target thickness of S-doped silicon is no more than 3 nm, in a case where the effective mass of the electron is 0.2 m, and the target thickness of S-doped silicon is no more than 2 nm, in a case where the effective mass of the electron is 0.5 m. The target thickness of S-doped silicon is no less than an atomic distance of the matrix semiconductor (e.g., 0.1 nm). Please note that the target value of 200 meV is determined by considering referring to the carrier activation energy of aluminum (Al) impurities in a silicon carbide (SiC) semiconductor (about 200 meV). A carrier activation ratio is as small as 10% mainly due to the large activation energies, depending on the aluminum (Al) concentration. In other words, dissociation of the electron-hole pair may be decreased by 90%, if the activation energy increases up to 200 meV, depending on the matrix material and the like.

Therefore, the quenching problem at the room temperature may be solved and the strong luminescence from sulfur in the silicon at room temperature may be obtained.

Formation of the active layer using the impurity-doped ultra-thin silicon film

Figure 8A:
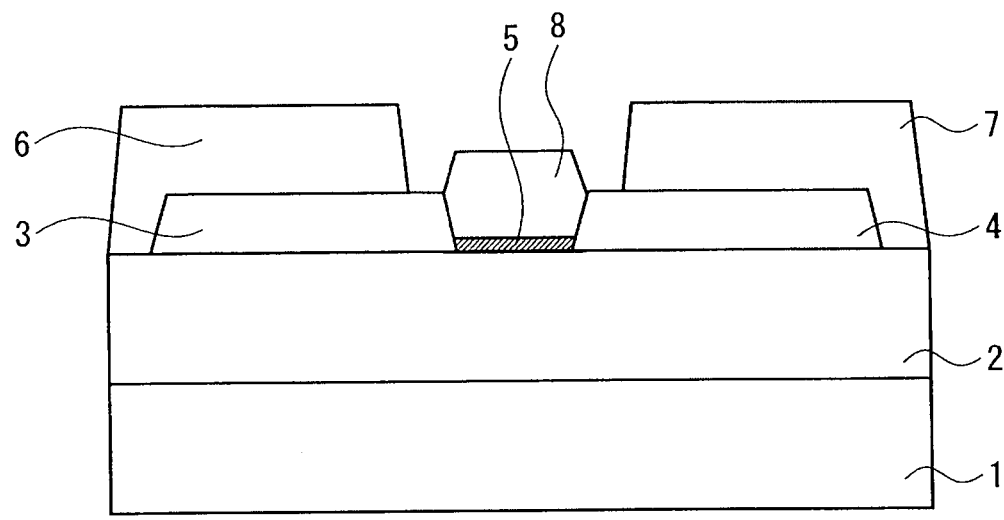
FIG. 8A is a cross-sectional view of a current injection type silicon light-emitting device according to an embodiment of the present invention.
Figure 8B:
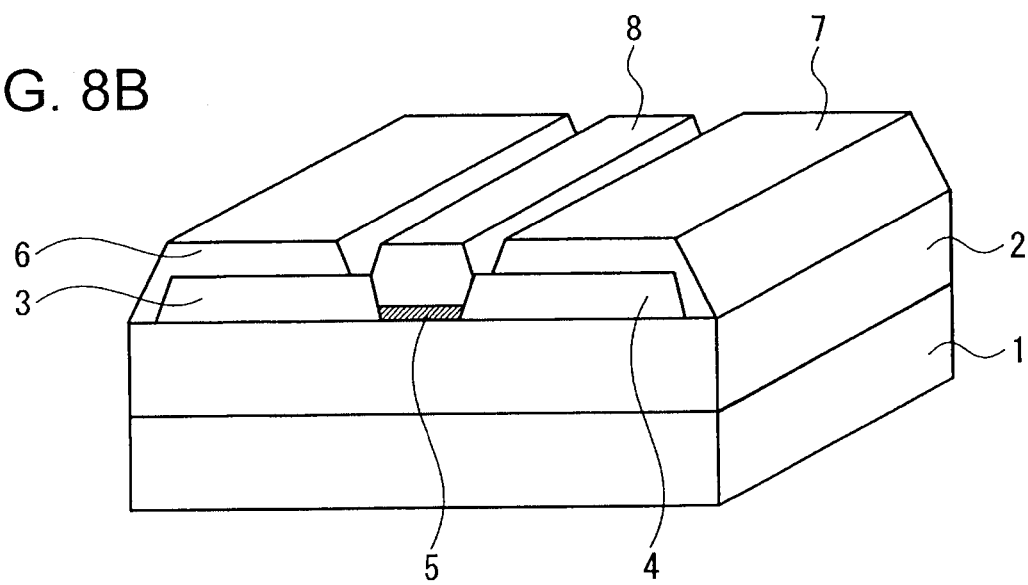
FIG. 8B is a perspective view of the current injection type silicon light-emitting device of FIG. 8A.

FIGS. 8A and 8B illustrate cross-sectional and perspective views of a current injection type silicon light-emitting device according to an embodiment of the present invention. This device is only an example to explain the formation of the impurity-doped ultra-thin silicon film, and therefore other device structure may be applied.

The device in FIGS. 8A and 8B has a buried silicon oxide film 2 formed in a semi-insulating silicon substrate 1, a $p^+$ region 3 formed on silicon oxide film 2, an impurity-doped ultra-thin silicon film which is an active layer 5, and an $n^+$ region 4. Reference numeral 8 denotes an oxide film as described below. In this embodiment, $p^+$ region 3, the $n^+$ region 4, and active region 5 are arranged on substantially the same plane over silicon oxide film 2. The $p^+$ region 3 is in contact with a p electrode 6, and $n^+$ region 4 is in contact with an n-electrode 7. Electrons and holes produce a recombination radiation in a region where impurity-doped ultra-thin silicon film is arranged by injecting holes from the $p^+$ region 3 and electrons from the $n^+$ region 4.

A device formation method is shown with reference to FIGS. 9A to 9F, taking the S-doped ultra-thin silicon film as an example.

As shown in FIGS. 9A to 9D, the buried silicon oxide film 2 is formed in the semi-insulating silicon substrate 1, and then the $p^+$ region 3 and the $n^+$ region 4 are respectively formed to sandwich an active layer formation region 51 in the same plane on the silicon oxide film 2 by a pattern formation of a nitride film 31, an application of resist layers 32 and 33, and ion implantation.

As shown in 9E, the activation layer formation region 51 is greatly thinned upon oxidation and an active layer 5 is formed by LOCOS (Local Oxidation of Silicon) processing. Thickness of the active layer 5 is controlled by oxidation temperature and oxidation time.

Figure 9A:
FIGS. 9A to 9F are schematic views illustrating a formation process of a light-emitting device according to an embodiment of the present invention.
Figure 9B:
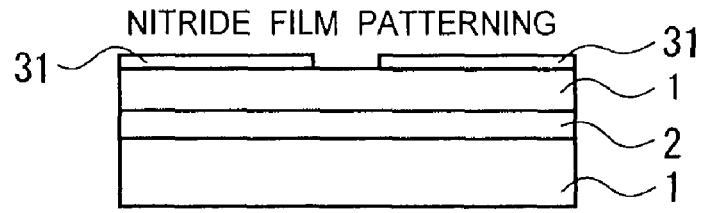
Figure 9C:
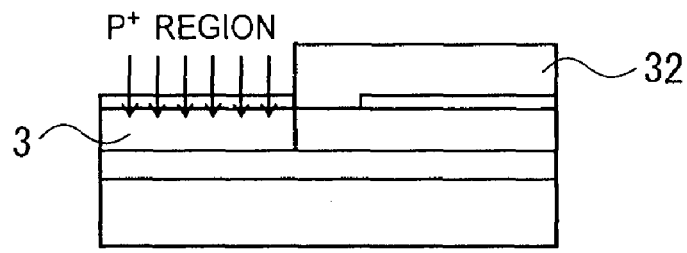
Figure 9D:
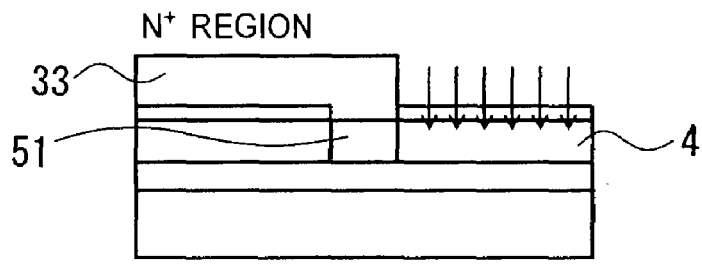
Figure 9E:
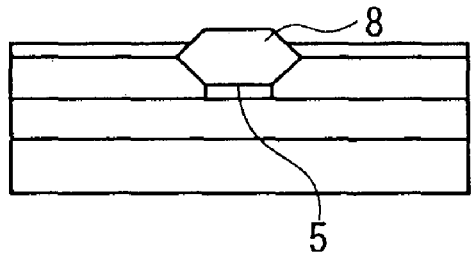
Figure 9F:
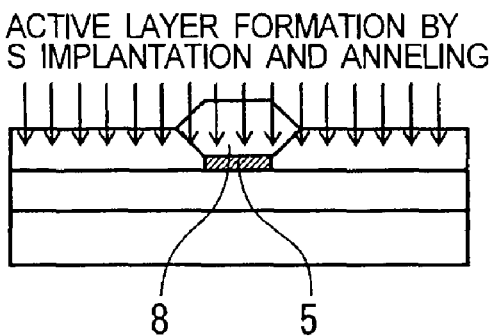

As shown in FIG. 9F, sulfur as an impurity is injected in the active layer 5. In the sulfur implantation process, sulfur ion implantation is performed to optimize, for example, energy, dose amount, a surface orientation of the substrate, a tilt angle and substrate temperature. These implantation parameters are selected to include the impurity-doped ultra-thin silicon film in sulfur implantation distribution.

Finally, the disordered crystal lattice is recovered by an annealing process (not illustrated). The residual defects in the crystal are decreased by adjusting an annealing temperature, time and atmosphere. The annealing condition depends on the impurity type. In the case of sulfur, the residual defects were greatly decreased when the crystallinity was recovered by an annealing process in the nitrogen atmosphere once and the resultant crystal was annealed in the oxide atmosphere. As a result, the crystallinity of the ultra-thin silicon film was improved. It is believed that the effect of an annealing process in the oxide atmosphere may be obtained by generations of interlattice Si atoms at the interface of the oxide film. The interlattice Si atoms react to the residual defects which are mainly consisted of vacancies.

As described above, the active layer of the impurity-doped ultra-thin silicon film may be formed by ion implantation and an annealing process. The impurity-doped ultra-thin silicon film may be formed by a combination of thermal diffusion and an annealing process. The impurity-doped ultra-thin silicon film formed by other methods may be also used.

Type of impurities and matrix semiconductors applied to the embodiments of the present invention The target impurities of embodiments of the present invention are impurities which create no less than two energy levels. These two energy levels provide the optically allowed transition within the silicon band gap. Including sulfur (S), selenium (Se), copper (Cu) and silver (Ag) have such energy levels. Accordingly, these elements are the target of embodiments of the present invention.

Further, a desired energy level may be obtained by a combination of more than two or more different elements even though these elements do not have a desired energy level in a single-element. According to the inventor's research, a combination of N and F or a combination of N and In corresponds to such combination. Accordingly, a combination of these elements is applied to the embodiments of the present invention.

Various indirect band gap semiconductors having a tetrahedral structure via $sp^3$ hybrid orbital may be used as the solid materials having a tetrahedral structure. To be more specific, the solid materials having a tetrahedral structure include carbon (C), silicon (Si), germanium (Ge), tin (Sn) and lead (Pb); those of a sphalerite structure such as SiC, GeC, BN, BP, AlP, AlAs, AlSb, and GaP; those of a structure similar to the above such as $Si_xGe_{1-x}$, $Si_xGe_yC_{i-x-y}$, $Ga(P_xAs_{1-x})$, $(Ga_xIn_{1-x})P$, $(Al_xGa_{1-x})As$, $(Al_xGa_{1-x})Sb$, $(Al_xIn_{1-x})Sb$, $(Ga_xIn_{1-x})(P_yAs_{1-y})$, and $(Al_xGa_yIn_{1-x-y})P$, where $0<x<1$, $0<y<0$ and $0<x+y<1$; and those of a wurtzite structure may be used. In this embodiment, silicon is shown as illustrative but we observed that a strong emission at low temperature was obtained as for SiGe and Ge based on the same principle.

In this embodiment, an n-electrode and a p-electrode are used as an excitation unit to create electron-hole pairs (excitons) in the active layer and generate an emission. The excitation unit may also be an excitation light source, an exciton electron source and an exciton X-ray source instead of the electrodes.

As described above, a strong luminescence, which is as strong as the direct gap compound semiconductor, is generated at room temperature by the ultra-thin film of the direct semiconductors doped with specific impurity to obtain the active layer.

Preferred embodiments of the present invention will be described.

FIGS. 8A and 8B illustrate a detailed example of a current injection type silicon light-emitting device according to one embodiment.

The impurity-doped ultra-thin silicon film as an active layer 5 was doped with sulfur as an impurity. Sulfur had a concentration of $1 \times 10^{18}$ cm$^{-3}$ and the silicon layer of the active layer 5 has a thickness of 2 nm.

Sulfur impurities used in this embodiment create at least two energy levels connected with the allowed transition within the silicon band gap. In the crystal silicon, an excitation level and a silicon conduction band derived from sulfur are energetically closely located. Electrons escape from sulfur to silicon and electron-hole pair of sulfur may quench due to the dissociation of the electron-hole pair. According to the embodiment, the room temperature luminescence is realized by increasing the binding energy of the electron-hole pair due to the ultra-thin silicon. Since the transition itself is optically allowed, dissociation is decreased.

When the light-emitting device configured in this manner is electrically operated, holes are injected from the $p^+$ region 3 and electrons are injected from the $n^+$ region 4. Recombination of electron-hole pairs in the active layer 5 which is a sulfur-doped ultra-thin silicon film enables electroluminescence to occur.

Figure 10:
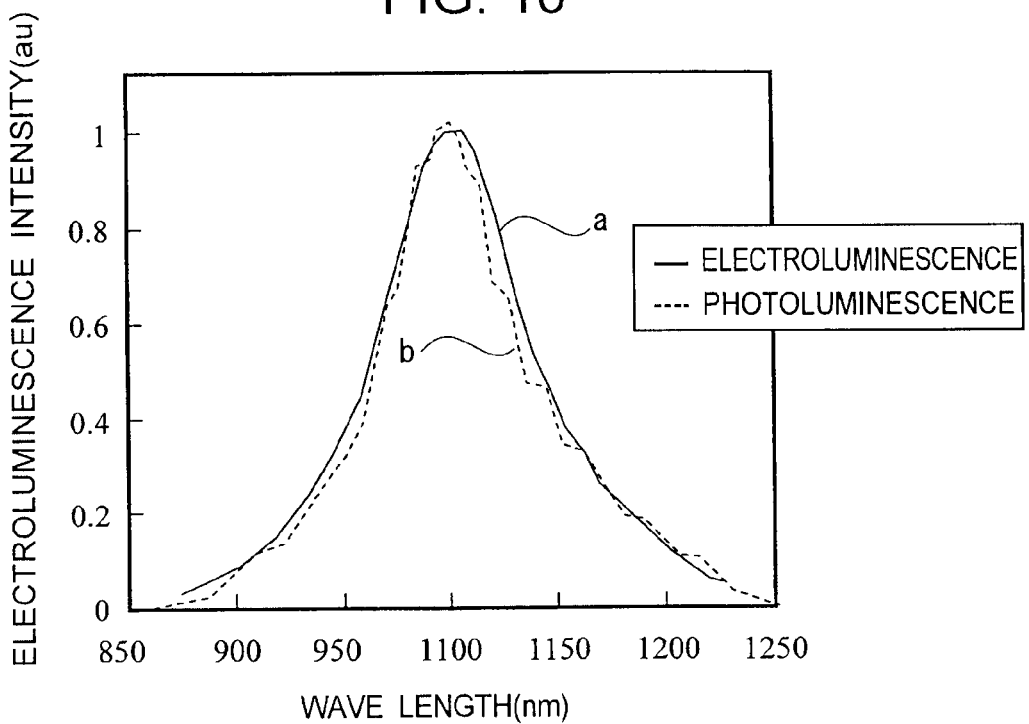
FIG. 10 is a graph of an electroluminescence spectrum and I-V characteristics of a light-emitting device according to the first embodiment of the present invention.

FIG. 10 is a view of an emission spectrum generated by a current injection. As shown in FIG. 10, PL emission spectrum results, in a case where a titanium-sapphire laser was incident on the active layer 5 by the main wavelength of 800 nm and a pulse width of 1 ps is additionally shown.

As shown in FIG. 10, a current injection emission having a peak value of about 1.1 μm (~1.1 eV) was obtained. The shape of the electroluminescence spectrum (solid line "a") was in good agreement with that of the photoluminescence spectrum (dashed line "b"). Certainly a radiative recombination in the sulfur-doped ultra-thin silicon film of the active layer 5 was confirmed. Note that the photoluminescence due to sulfur at low temperature generates in the 1.5 μm band (~0.8 eV), in a case where the ultra-thin film is not used. The reduction of the luminescent wavelength according to the embodiment is caused by the quantum confinement effect due to the ultra-thin active layer 5.

The external quantum efficiency φ of the electroluminescence at this time is estimated to be about φ~0.01. The external quantum efficiency φ is related to the internal quantum efficiency η as shown in the following equation:

$$\Phi = \xi \times \eta \quad (1),$$

$$\xi = 0.5 \times [1 - \cos(\arcsin(1/Nsi))] \sim 0.02 \quad (2).$$

Where ξ is the light extract efficiency and Nsi is the index of refraction of silicon (about 3.6).

Calculating the internal quantum efficiency from the equation (1) and (2), it is estimated that η~0.5. It has been understood that a highly efficient radiative recombination is generated in the sulfur-doped ultra-thin silicon film region.

According to this embodiment, the room temperature luminescence is realized by increasing the binding energy of the electron-hole pair due to the ultra-thin film of silicon, and dissociation is decreased, since the optical transition itself due to sulfur is optically allowed. It has been understood that the impurity-doped ultra-thin silicon film is quite effective to cause silicon, which is an indirect semiconductor, to emit light.

COMPARISON EXAMPLE

In this example, electroluminescence was investigated using the light-emitting device which has the similar structure as that of the first embodiment except that the sulfur-doped silicon layer of the active layer has a thickness of 200 nm instead of the ultra-thin film.

As a result, the device of the comparison example was non-radiative even when a current was injected. The light pulse excitation was performed by the titanium-sapphire laser for confirmation. The device emitted strong light in the 1.5 μm band at low temperature of liquid helium (He) temperature while the device was non-radiative at room temperature.

In the comparative example, sulfur impurities in the active layer emit light at a low temperature, however, the electron-hole pair dissociates and quenches easily at room temperature because the electrons escape from the excitation level due to sulfur to the silicon conduction band. The comparison example was found to be non-radiative.

Therefore, it has been understood that the impurity-doped ultra-thin silicon film is quite effective to increase the binding of the electron-hole pair and decrease the dissociation to realize the room temperature luminescence from silicon.

In this embodiment, emission due to the current injection was investigated using the light-emitting device similar to that in the first embodiment, except that a combination of N and F is used as impurities in the active layer instead of sulfur. In this embodiment, N and F have a concentration of $1 \times 10^{19}$ cm$^{-3}$.

When the light-emitting device configured in this manner is electrically operated, electrons and holes are recombined and electroluminescence occurs in the active layer 5 which comprises the N-F doped ultra-thin silicon film.

Figure 11:
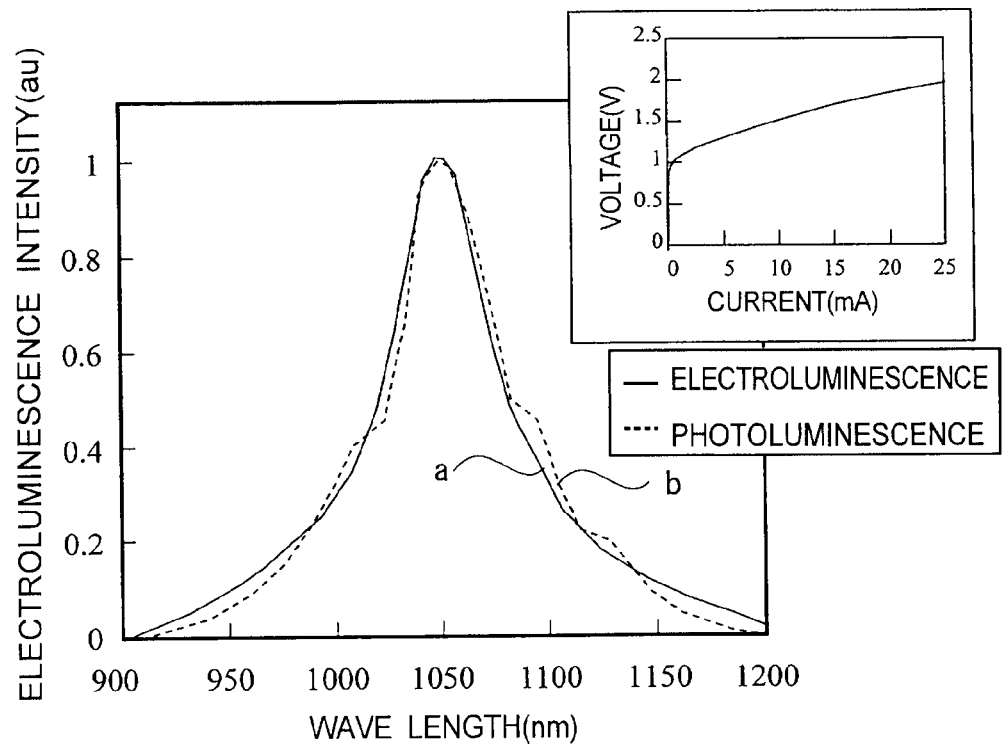
FIG. 11 is a graph of an electroluminescence spectrum, a photoluminescence spectrum, and I-V characteristics of a light-emitting device according to the second embodiment of the present invention.

FIG. 11 is a view of a photoluminescence spectrum and I-V characteristics of the device. The electroluminescence spectrum (solid line "a") was in good agreement with the photoluminescence spectrum (dashed line "b"). The energy of the spectrum peak (peak wavelength: 1.05 µm) in both spectrums was in good agreement with the rising voltage of the I-V characteristics. Consequently, a radiative recombination generated by a current injection in the N-F-doped ultra-thin silicon film was certainly confirmed.

Using equations (1) and (2), the internal quantum efficiency of the active layer was estimated to be about 0.7 based on the external quantum efficiency of the electroluminescence at this time. It was confirmed that a highly efficient radiative recombination is generated in the N-F doped ultra-thin silicon film.

According to the embodiment of the present invention, it has been understood that the impurity-doped ultra-thin silicon film is quite effective to increase the binding of the electron-hole pair and to decrease the dissociation to realize the room temperature luminescence of silicon.

Figure 12A:
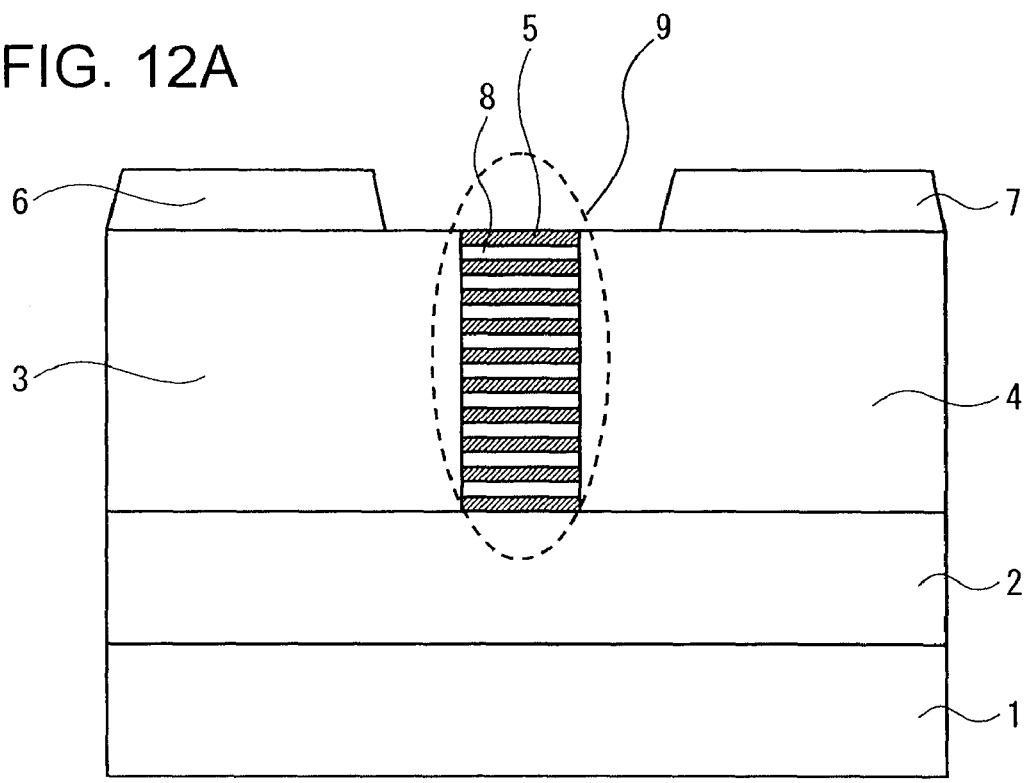
FIG. 12A is a cross-sectional view of a light-emitting device according to the third embodiment of the present invention.
Figure 12B:
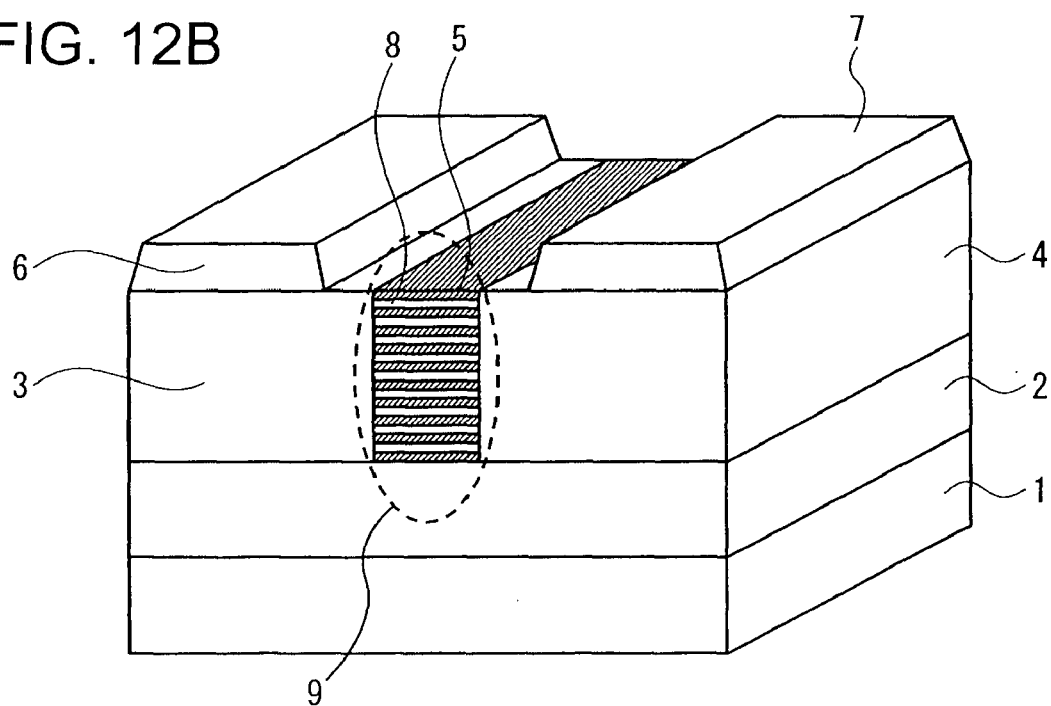
FIG. 12B is a perspective view of the light-emitting device of FIG. 12A.

In this embodiment, electroluminescence was investigated using the light-emitting device similar to that in the second embodiment, except that an N-F doped ultra-thin silicon multilayer structure as schematically shown in FIG. 12 is used as the active layer 5.

Before the explanation of the embodiment, a manufacturing method of the ultra-thin silicon multilayer structure 9 is supplemented. Lateral solid phase epitaxial growth technique in amorphous silicon using an annealing process is applied to form the ultra-thin silicon multilayer structure 9.

Figure 13A:
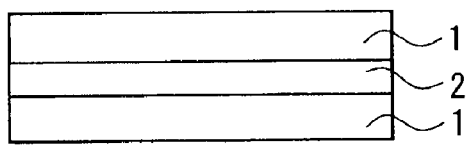
FIGS. 13A to 13I are views illustrating a formation process of the light-emitting device of FIG. 12A.
Figure 13B:
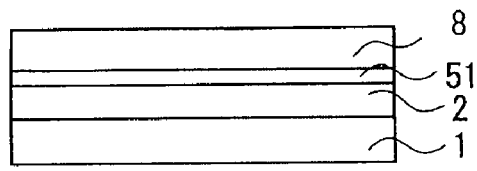
Figure 13C:
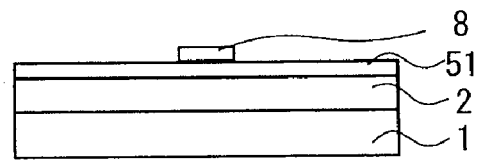
Figure 13D:
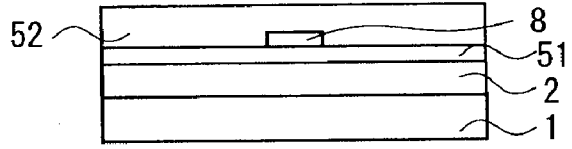

FIGS. 13A to 13I show cross-sectional views of the ultra-thin silicon multilayer structure 9 formed according to the embodiment of the present invention. As shown in FIG. 13A, a silicon layer 1 of an SOI substrate is greatly thinned to be a silicon layer 51 (see FIG. 13B) upon oxidation such as a dry oxidation. An oxide film 8 are remained only in the active layer by patterning and etching processing, and the silicon layer 51 of the other parts is exposed (see FIG. 13C). The amorphous silicon 52 is stacked by a CVD method and the like (see FIG. 13D). The surface is flattened by a flattening process such as a CMP method is performed, if desired. The amorphous silicon 52 is changed into the single crystal silicon 51 by a thermal annealing process (see FIG. 13E). Crystallization of the amorphous silicon 52 is generated from the interface of the ultra-thin silicon layer and crystally grown in the lateral direction on the oxide film 8. For this reason, the process is called lateral solid phase epitaxial growth.

Figure 13E:
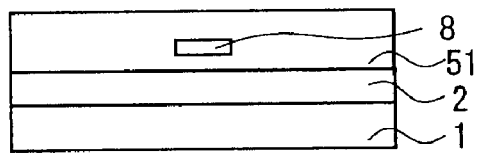
Figure 13F:
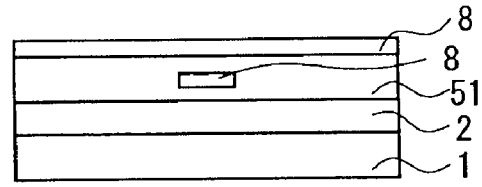
Figure 13G:
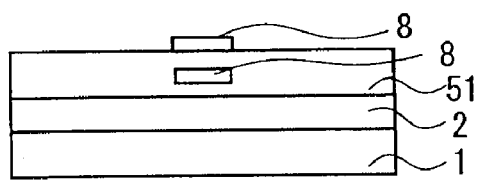
Figure 13H:
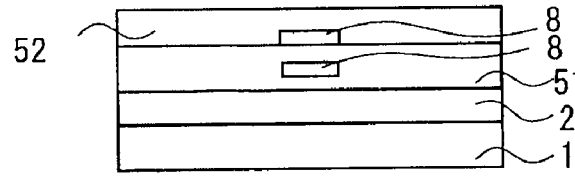
Figure 13I:
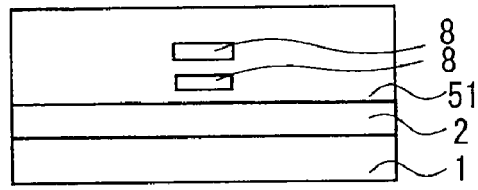

Lateral solid phase epitaxial growth is finished when the crystal surfaces grown from either side comes into contact with each other on the oxide film 8. As a result, a structure in which the oxide film 8 is partially buried in the target single crystal silicon 51 is completed (FIG. 13E). At this time, a silicon layer 53 of the top layer is oxidized again (FIG. 13F), an oxide film 8 are remained only in the active layer by patterning and etching processing, and a silicon layer 51 of the other parts is exposed (FIG. 13G). The amorphous silicon 52 is stacked by a CVD method and the like (FIG. 13H). The amorphous silicon 52 is changed into the single crystal silicon 51 by a thermal annealing process (FIG. 13I). The ultra-thin silicon layer structure can be stacked to have two multi-layered layers in this way. The ultra-thin silicon multilayer structure 9 having N multi-layered layers may be fabricated by repeating the above processes N times. The impurities according to the embodiment of the present invention are ion-implanted. To obtain the target impurity-doped ultra-thin silicon multilayer structure 9, the crystallinity is recovered by an annealing process.

When the light-emitting device having the active layer comprising ten ultra-thin silicon layer structures of this embodiment is electrically operated, electrons and holes are recombined in the active layer and electroluminescence occurs. Using equations (1) and (2), the internal quantum efficiency of the active layer was estimated to be about 1 based on the external quantum efficiency of the electroluminescence at this time. In the N-F doped ultra-thin silicon multilayer structure, it is understood that the highly effective radiative recombination is obtained. The reason for the improvement of the internal quantum efficiency is under investigation. It is estimated that a carrier overflow which does not contribute to the electroluminescence may be drastically decreased due to the increase of the volume of the active layer.

According to this embodiment, it has been understood that the impurity-doped ultra-thin silicon film is quite effective to increase the binding of the electron-hole pair, to decrease the dissociation and to fabricate the multi-layer to realize the room temperature luminescence from silicon. The multilayer structure according to this embodiment is not limited to the N-F doped ultra-thin silicon but may also be applied to the active layers doped with other impurities such as sulfur.

Figure 14:
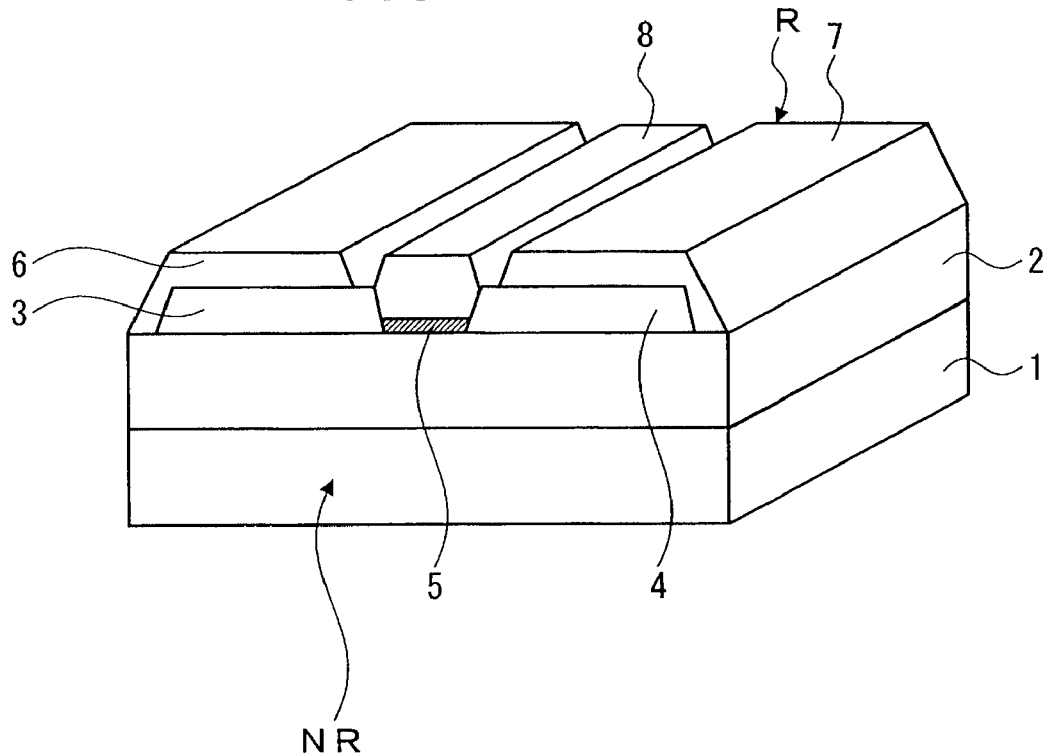
FIG. 14 is a perspective view of a light-emitting device according to the fourth embodiment of the present invention.

FIG. 14 is a perspective view of a light-emitting silicon device of an edge emission type according to the embodiment. As shown in FIG. 14, the light-emitting device is similar to that in the first embodiment, except that an antireflection coating NR is coated on one edge surface of the light-emitting device, and a reflection coating R formed on the other edge surface. In this structure, light is radiated from the edge surface on which the antireflection coating NR is coated.

Figure 15:
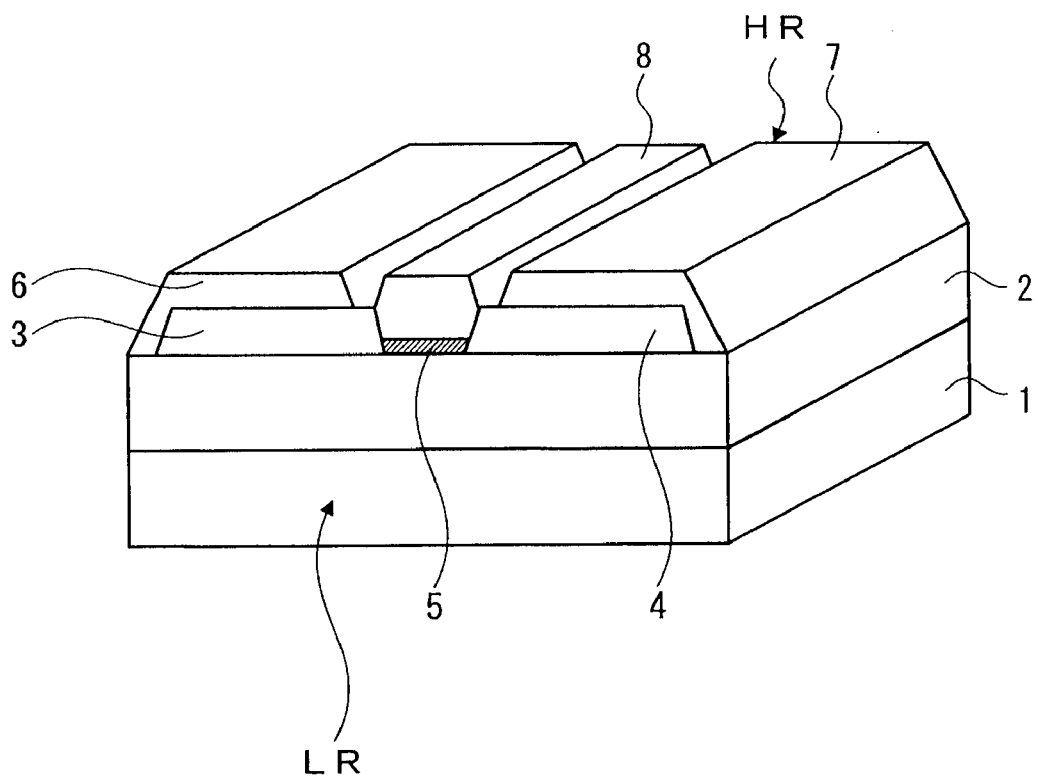
FIG. 15 is a perspective view of a light-emitting device according to the fifth embodiment of the present invention.

FIG. 15 is a perspective view of a laser diode (LD) of an edge emission type according to the embodiment. As shown in FIG. 15, the LD device, which is an edge-emitting device, is similar to that in the first embodiment, except that a low reflection dielectric multilayer mirror LR is formed on one edge surface of the LD device, and a high reflection dielectric multilayer mirror HR formed on the other edge surface to sandwich the active region.

When the LD device is electrically operated, a laser light is oscillated from the edge surface. Examining the emission spectrum, the spectrum becomes broad when the current is no more than the threshold current, however, the spectrum becomes sharp and monochromatic. This indicates that it is possible to generate continuous laser oscillation when the current is no more than the threshold current.

Figure 16:
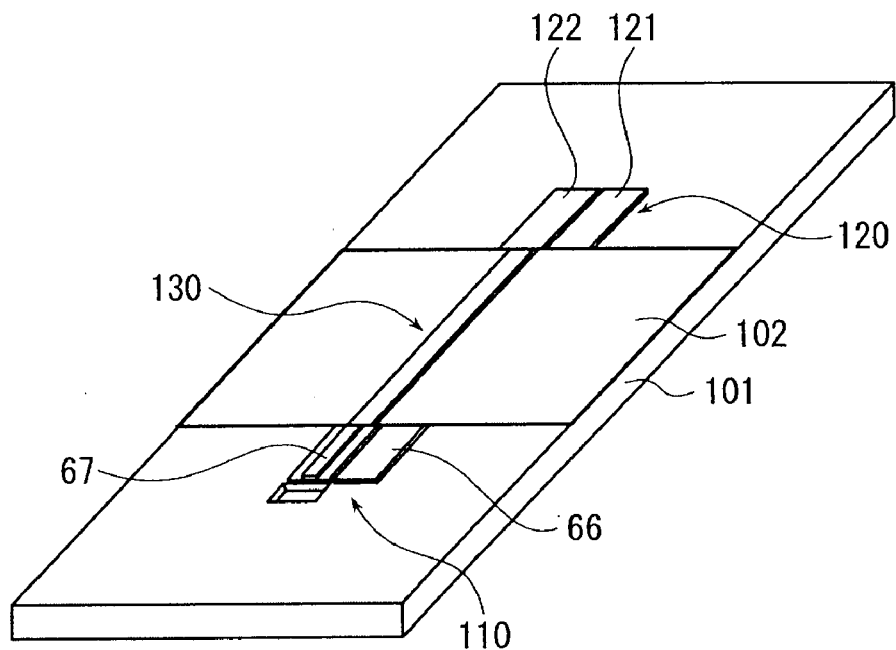
FIG. 16 is a perspective view of an optical device array according to the sixth embodiment of the present invention.

FIG. 16 is a perspective view of an optical device array in this embodiment. The optical device array has a light-emitting device, a light receiving device and a waveguide for connecting the light receiving device on the same substrate. The optical device array permits generating, transmitting and receiving an optical signal. A plurality of the optical device arrays may be formed integrally.

As shown in FIG. 16, an edge-emitting LD device 110 for generating a signal and a germanium light receiving device 120 for receiving the signal are formed on a silicon substrate 101. An oxide film 102 is formed between LD device 110 and light receiving device 120, and a Si waveguide 130 for transmitting the optical signal is formed on oxide film 102. Edge-emitting LD device 110 is equal in structure to that of the fourth embodiment. As shown in FIG. 16A, an n-electrode 66 and a p-electrode 67 are illustrated. A trench is formed in substrate 101 in the vicinity of LD device 110 to expose the edge surface to the outside. FIG. 16 also shows an n-electrode 121 and a p-electrode 122 in respect of germanium light receiving device 120.

Figure 17:
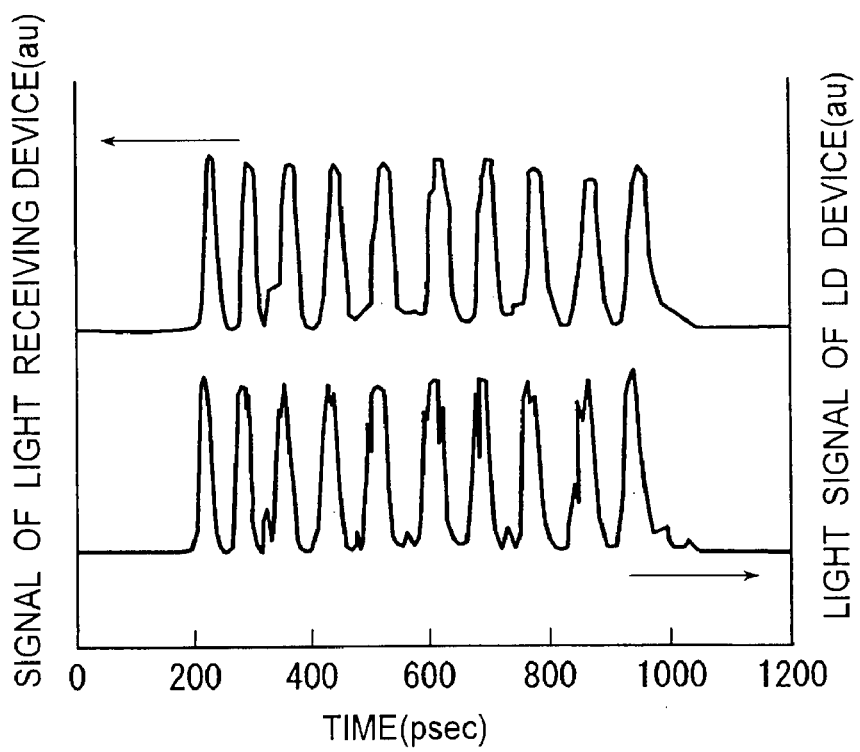
FIG. 17 is a chart of a response characteristic of a light-receiving device in response to the input from an LD device of the optical device array of FIG. 16.

FIG. 17 is a graph of the optical signal generated from the LD device and the output response of the light receiving device. As apparent from FIG. 17, the output signal is modulated under the frequency of 50 GHz relative to the high-speed modulated signal under the frequency of 50 GHz.

In this fashion, it has been understood that the optical device array in this embodiment permits transmission of an optical signal at a high speed. It is technically impossible in the conventional technique to form an optical device array for transmitting an optical signal on a wafer. However, this embodiment makes it possible to form such a light-emitting apparatus.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A light-emitting device, comprising:
an active region formed from a semiconductor material, the semiconductor material having a tetrahedral structure and including an impurity, the impurity creating at least two energy levels connected with the allowed transition within a band gap of the semiconductor material;
an n-type region and a p-type region in contact with the active region, the active region disposed between the n-type and p-type regions; and
an excitation element configured to inject an electron from the n-type region and inject a hole from the p-type region so as to generate an electron-hole pair in the active region,
wherein the active region has a thickness no less than an atomic distance of the semiconductor material and no more than 5 nm.

2. A light-emitting device according to claim 1, wherein the active region has a thickness no more than 3 nm.

3. A light-emitting device according to claim 1, wherein the active region has a thickness no more than 2 nm.

4. A light-emitting device according to claim 1, wherein a plurality of the active regions are stacked.

5. A light-emitting device according to claim 1, wherein the impurity includes at least one of S, Se, Cu and Ag.

6. A light-emitting device according to claim 1, wherein the impurity includes a combination of N and F or a combination of N and In.

7. A light-emitting device according to claim 1, wherein the active region has first and second edge surfaces, the first edge surface being antireflective and the second edge surface being reflective.

8. A light-emitting device according to claim 1, further comprising an optical resonator formed by a pair of mirror planes having different reflectivities from each other and arranged to sandwich the active region.

9. An optical device array, comprising:
a light-emitting device including:
an active region formed from a semiconductor material, the semiconductor material having a tetrahedral structure and including an impurity, the impurity creating at least two energy levels connected with the allowed transition within a band gap of the semiconductor material, the active region having a thickness no less than an atomic distance of the semiconductor material and no more than 5 nm;
an n-type region and a p-type region in contact with the active region, the active region disposed between the n-type and p-type regions; and
an excitation element configured to inject an electron from the n-type region and inject a hole from the p-type region so as to generate an electron-hole pair in the active region;
a light-receiving device; and
a waveguide structure connecting the light-emitting device and the light-receiving device, and
wherein the light-emitting device, light-receiving device and the waveguide structure are arranged on the same substrate.

10. A light-emitting device, comprising:
a plurality of oxide films formed above a substrate;
a plurality of active layers formed above the substrate, each of the active layers being formed to be stacked on each of the oxide films alternatively, the active layer being formed from a semiconductor material,
the semiconductor material having a tetrahedral structure and including an impurity, the impurity creating at least two energy levels connected with the allowed transition within a band gap of the semiconductor material;
an n-type region and a p-type region in contact with the active layers, the active layers disposed between the n-type and p-type regions; and
an excitation element configured to inject an electron from the n-type region and inject a hole from the p-type region so as to generate an electron-hole pair in the active region,
wherein each of the active layers has a thickness no less than an atomic distance of the semiconductor material and no more than 5 nm.

11. A light-emitting device according to claim 10, wherein the active layers have a thickness no more than 3 nm.

12. A light-emitting device according to claim 10, wherein the active layers have a thickness no more than 2 nm.

13. A light-emitting device according to claim 10, wherein the impurity includes a combination of N and F or a combination of N and In.

14. A light-emitting device according to claim 10, wherein the active layers contain an impurity such as sulfur.

15. A light-emitting device according to claim 10, wherein each of the active layers has first and second edge surfaces, the first edge surface being antireflective and the second edge surface being reflective.

16. A light-emitting device according to claim 10, further comprising:
an optical resonator formed by a pair of mirror planes having different reflectivity from each other and arranged to sandwich the active layers.

* * * * *